United States Patent
Umezawa (10) Patent No.: US 10,347,652 B2
(45) Date of Patent: Jul. 9, 2019

(54) SEMICONDUCTOR MEMORY DEVICE

(71) Applicant: Toshiba Memory Corporation, Minato-ku (JP)

(72) Inventor: Yusuke Umezawa, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/698,106

(22) Filed: Sep. 7, 2017

(65) Prior Publication Data

US 2018/0277562 A1  Sep. 27, 2018

(30) Foreign Application Priority Data

Mar. 23, 2017  (JP) ................. 2017-058016

(51) Int. Cl.
| | |
|---|---|
| *G11C 16/10* | (2006.01) |
| *H01L 27/11582* | (2017.01) |
| *G11C 16/04* | (2006.01) |
| *H01L 27/11573* | (2017.01) |
| *H01L 27/1157* | (2017.01) |
| *G11C 11/56* | (2006.01) |

(52) U.S. Cl.
CPC .... *H01L 27/11582* (2013.01); *G11C 11/5628* (2013.01); *G11C 11/5635* (2013.01); *G11C 11/5642* (2013.01); *G11C 16/0466* (2013.01); *G11C 16/0483* (2013.01); *G11C 16/107* (2013.01); *H01L 27/1157* (2013.01); *H01L 27/11573* (2013.01)

(58) Field of Classification Search
CPC ................. G11C 15/04; G11C 16/10
USPC ............................ 365/49.1, 185.18
See application file for complete search history.

(56) References Cited

U.S. PATENT DOCUMENTS

| | | | | | |
|---|---|---|---|---|---|
| 5,943,260 | A | * | 8/1999 | Hirakawa | G11C 11/5621 365/185.03 |
| 6,055,188 | A | * | 4/2000 | Takeuchi | G11C 16/0483 365/185.03 |
| 6,141,238 | A | * | 10/2000 | Forbes | G11C 11/005 257/E27.104 |

(Continued)

FOREIGN PATENT DOCUMENTS

| | | |
|---|---|---|
| JP | 2006-277785 | 10/2006 |
| JP | 2007-266143 | 10/2007 |

(Continued)

*Primary Examiner* — Michael T Tran
(74) *Attorney, Agent, or Firm* — Oblon, McClelland, Maier & Neustadt, L.L.P.

(57) ABSTRACT

A semiconductor memory device includes a substrate, electrode films provided on a first direction side of the substrate and arranged with spacing from each other along the first direction, semiconductor members extending in the first direction, a charge storage member provided between each of the electrode films and each of the semiconductor members, and a control circuit. Memory cells are formed in crossing portions of the electrode films and the semiconductor members. The control circuit classifies the memory cells into a first group and a second group. The control circuit performs writing, reading, and erasing of n-value data (n being an integer of two or more) on the memory cell of the first group. The control circuit performs writing, reading, and erasing of m-value data (m being an integer larger than n) on the memory cell of the second group.

16 Claims, 8 Drawing Sheets

(56) References Cited

U.S. PATENT DOCUMENTS

| | | | |
|---|---|---|---|
| 8,339,824 B2* | 12/2012 | Cooke | G06K 9/6276 365/49.1 |
| 9,455,271 B1* | 9/2016 | Setta | H01L 27/11582 |
| 10,128,313 B2* | 11/2018 | Chen | G11C 13/0007 |
| 2002/0153614 A1* | 10/2002 | Ema | H01L 21/76897 257/773 |
| 2003/0095448 A1* | 5/2003 | Ichige | G11C 16/04 365/200 |
| 2003/0161192 A1* | 8/2003 | Kobayashi | G11C 16/0475 365/200 |
| 2005/0169051 A1* | 8/2005 | Khalid | G11C 7/06 365/185.03 |
| 2005/0207220 A1 | 9/2005 | Takeuchi | |
| 2006/0215450 A1 | 9/2006 | Honma et al. | |
| 2007/0252201 A1 | 11/2007 | Kito et al. | |
| 2007/0258312 A1* | 11/2007 | Richards | G02B 26/0841 365/230.03 |
| 2008/0239811 A1 | 10/2008 | Tanaka | |
| 2009/0109744 A1* | 4/2009 | Aritome | G11C 11/5628 365/185.03 |
| 2009/0242968 A1* | 10/2009 | Maeda | H01L 27/11551 257/324 |
| 2010/0081267 A1* | 4/2010 | Purayath | H01L 21/28273 438/594 |
| 2010/0219392 A1* | 9/2010 | Awaya | H01L 27/0688 257/3 |
| 2010/0230740 A1* | 9/2010 | Yaegashi | H01L 27/11565 257/324 |
| 2010/0302828 A1* | 12/2010 | Park | G11C 8/10 365/49.1 |
| 2010/0328980 A1* | 12/2010 | Kim | G11C 5/02 365/49.1 |
| 2011/0103149 A1* | 5/2011 | Katsumata | G11C 16/0483 365/185.18 |
| 2011/0156132 A1* | 6/2011 | Kiyotoshi | H01L 27/11575 257/326 |
| 2011/0188321 A1* | 8/2011 | Kito | G11C 16/04 365/185.29 |
| 2011/0228604 A1* | 9/2011 | Eli | G11C 11/5628 365/185.09 |
| 2011/0233646 A1* | 9/2011 | Mizushima | H01L 27/11578 257/324 |
| 2011/0249480 A1* | 10/2011 | Cho | G11C 29/789 365/49.1 |
| 2011/0280084 A1* | 11/2011 | Radke | G11C 11/26 365/185.21 |
| 2011/0284817 A1* | 11/2011 | Sasago | H01L 27/1021 257/5 |
| 2012/0008360 A1* | 1/2012 | Kang | G11C 15/00 365/49.1 |
| 2012/0026775 A1 | 2/2012 | Yamada et al. | |
| 2012/0127771 A1* | 5/2012 | Atwal | G06F 12/0895 365/49.1 |
| 2012/0280303 A1* | 11/2012 | Kiyotoshi | H01L 27/11524 257/316 |
| 2013/0033928 A1* | 2/2013 | Kawahara | G11C 11/15 365/158 |
| 2013/0049096 A1* | 2/2013 | Wang | H01L 29/7889 257/324 |
| 2013/0308392 A1* | 11/2013 | Nishijima | G11C 11/404 365/189.02 |
| 2014/0056069 A1* | 2/2014 | Park | G11C 16/0483 365/185.05 |
| 2014/0061849 A1* | 3/2014 | Tanzawa | H01L 27/11531 |
| 2014/0153332 A1* | 6/2014 | Parthasarathy | G11C 29/52 365/185.09 |
| 2014/0177330 A1* | 6/2014 | Ting | H01L 29/66272 365/174 |
| 2014/0177335 A1* | 6/2014 | Xu | G11C 16/26 365/185.03 |
| 2014/0226408 A1* | 8/2014 | Tokiwa | G11C 16/32 365/185.18 |
| 2014/0258614 A1 | 9/2014 | Unno et al. | |
| 2015/0003137 A1* | 1/2015 | Lee | G11C 13/004 365/49.1 |
| 2015/0248936 A1* | 9/2015 | Best | G11C 15/046 365/49.17 |
| 2016/0064081 A1* | 3/2016 | Um | G11C 15/04 365/49.1 |
| 2016/0104717 A1* | 4/2016 | Lu | G11C 16/0483 365/185.22 |
| 2017/0069644 A1* | 3/2017 | Kikushima | H01L 27/11556 |
| 2017/0097782 A1* | 4/2017 | Ramalingam | G06F 3/0616 |
| 2017/0148815 A1* | 5/2017 | Fukuzumi | H01L 27/11582 |
| 2017/0178739 A1* | 6/2017 | Maejima | G11C 11/5628 |
| 2018/0122816 A1* | 5/2018 | Ramaswamy | G11C 11/221 |

FOREIGN PATENT DOCUMENTS

| | | |
|---|---|---|
| JP | 2008-020937 | 1/2008 |
| JP | 2008-257773 | 10/2008 |
| JP | 4427361 | 3/2010 |
| JP | 2012-033216 | 2/2012 |
| JP | 2014-175031 | 9/2014 |

* cited by examiner

SEMICONDUCTOR MEMORY DEVICE

CROSS-REFERENCE TO RELATED APPLICATIONS

This application is based upon and claims the benefit of priority from Japanese Patent Application No. 2017-058016, filed on Mar. 23, 2017; the entire contents of which are incorporated herein by reference.

FIELD

Embodiments relate to a semiconductor memory device.

BACKGROUND

In recent years, there has been proposed a stacked-type semiconductor memory device in which memory cells are integrated three-dimensionally. Such a stacked-type semiconductor memory device is provided with a stacked body in which electrode films and insulating films are alternately stacked on a semiconductor substrate. Semiconductor pillars are provided through the stacked body. A memory cell is formed for each crossing portion of the electrode film and the semiconductor pillar. A challenge for such a stacked-type semiconductor memory device is compatibility between high integration and high yield.

BRIEF DESCRIPTION OF THE DRAWINGS

FIG. 7A shows an 8-value operation, and FIG. 7B shows a 16-value operation;

DETAILED DESCRIPTION

According to one embodiment, a semiconductor memory device includes a substrate, a plurality of electrode films provided on a first direction side of the substrate and arranged with spacing from each other along the first direction, a plurality of semiconductor members extending in the first direction, a charge storage member provided between each of the plurality of electrode films and each of the plurality of semiconductor members, and a control circuit. A plurality of memory cells are formed in crossing portions of the plurality of electrode films and the plurality of semiconductor members. The control circuit classifies the plurality of memory cells into a first group and a second group. The control circuit performs writing, reading, and erasing of n-value data (n being an integer of two or more) on the memory cell of the first group. The control circuit performs writing, reading, and erasing of m-value data (m being an integer larger than n) on the memory cell of the second group.

An embodiment is now described.

Figure 1:
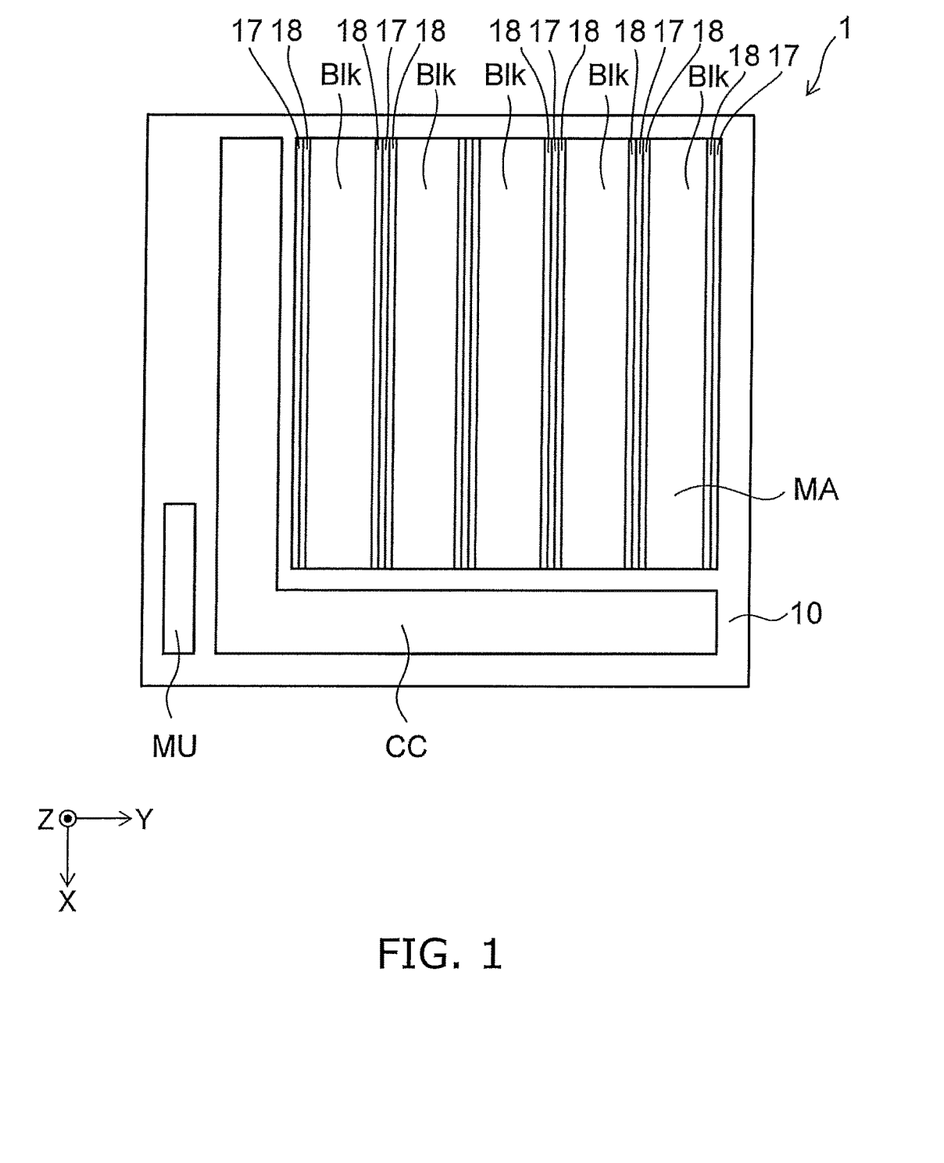
FIG. 1 is a schematic plan view showing a semiconductor memory device according to an embodiment.

FIG. 1 is a schematic plan view showing a semiconductor memory device according to the embodiment.

Figure 2:
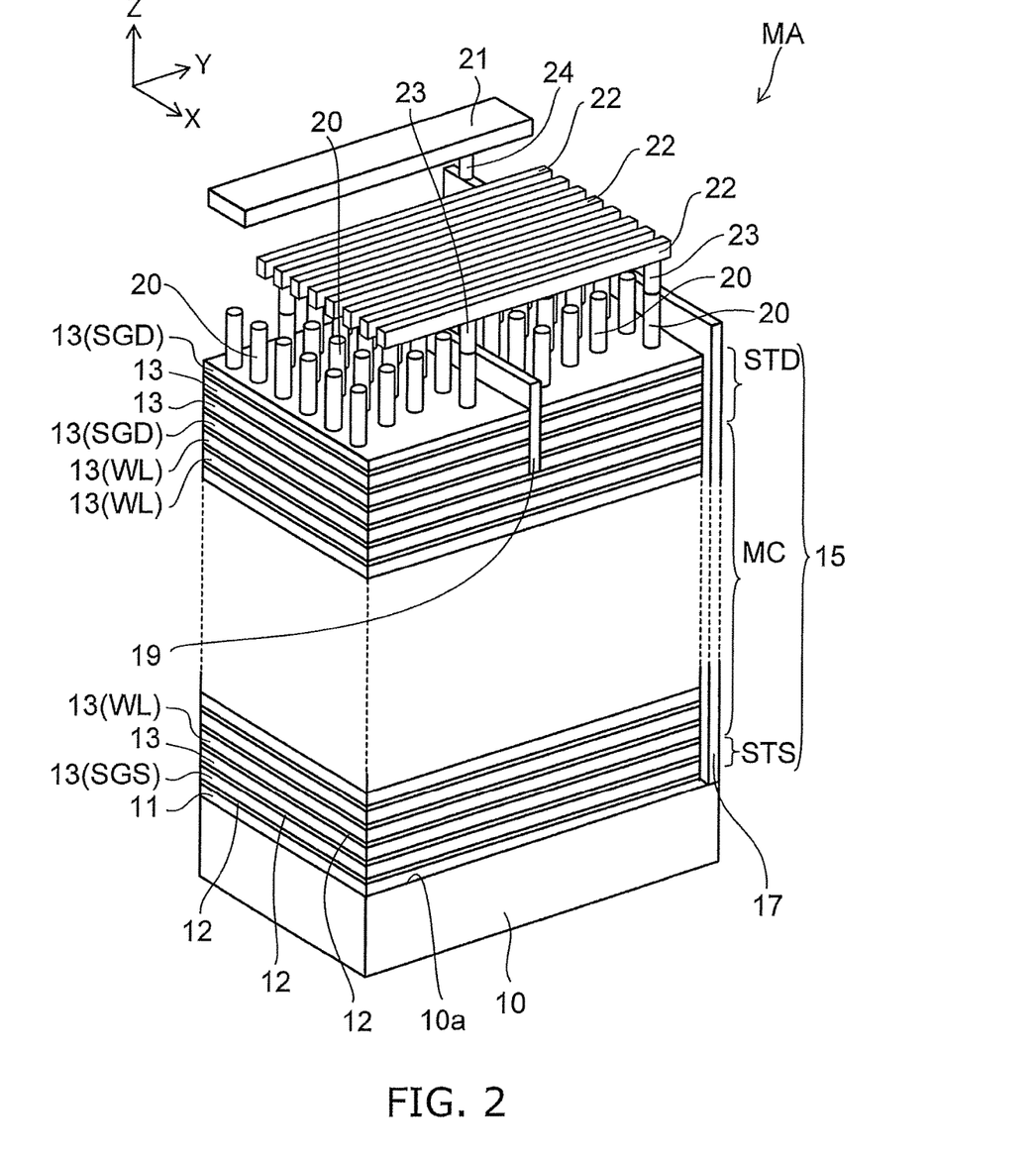
FIG. 2 is a perspective view showing a memory cell array of the semiconductor memory device according to the embodiment.

FIG. 2 is a perspective view showing a memory cell array of the semiconductor memory device according to the embodiment.

Figure 3:
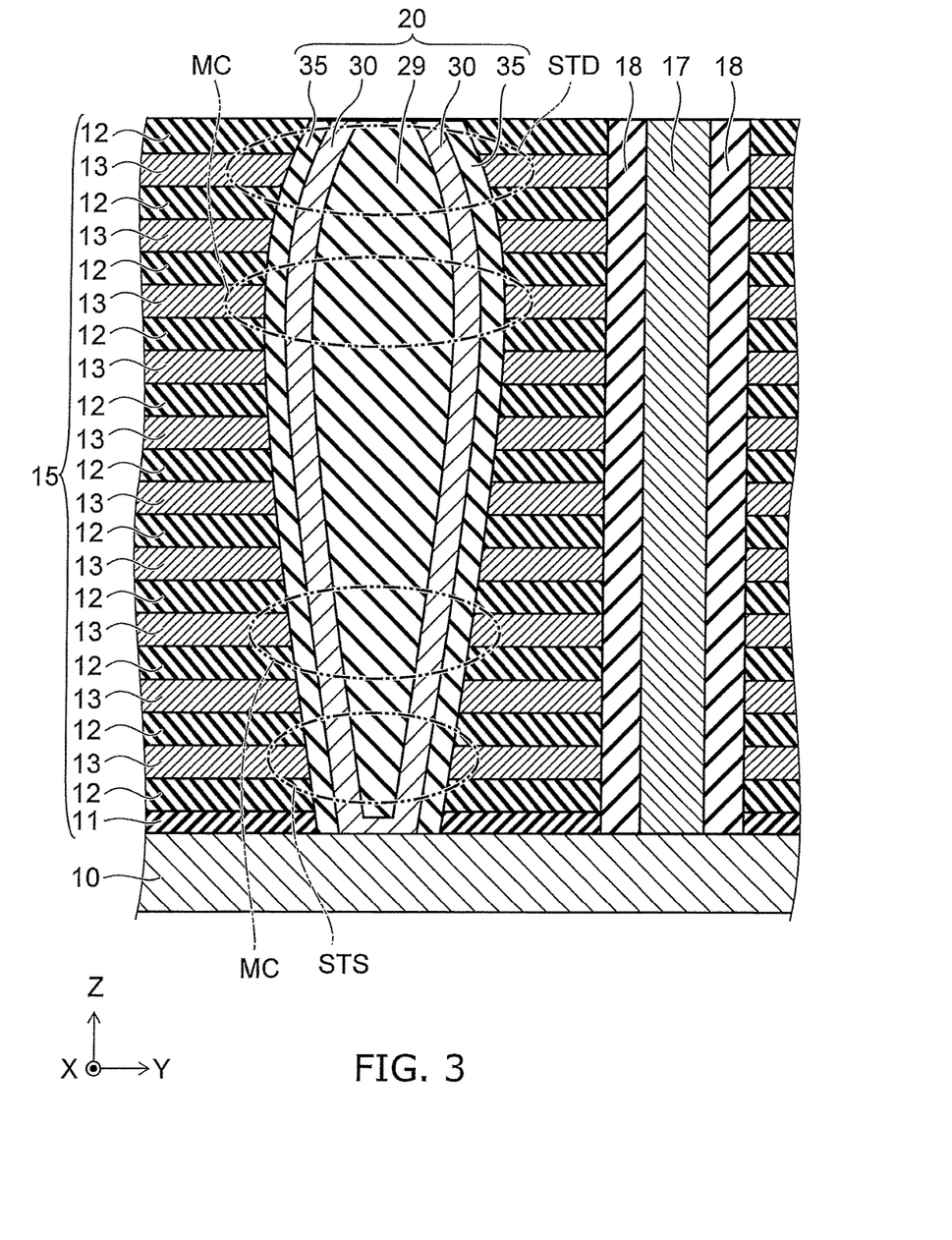
FIG. 3 is a sectional view showing the memory cell array of the semiconductor memory device according to the embodiment.

FIG. 3 is a sectional view showing the memory cell array of the semiconductor memory device according to the embodiment.

Figure 4:
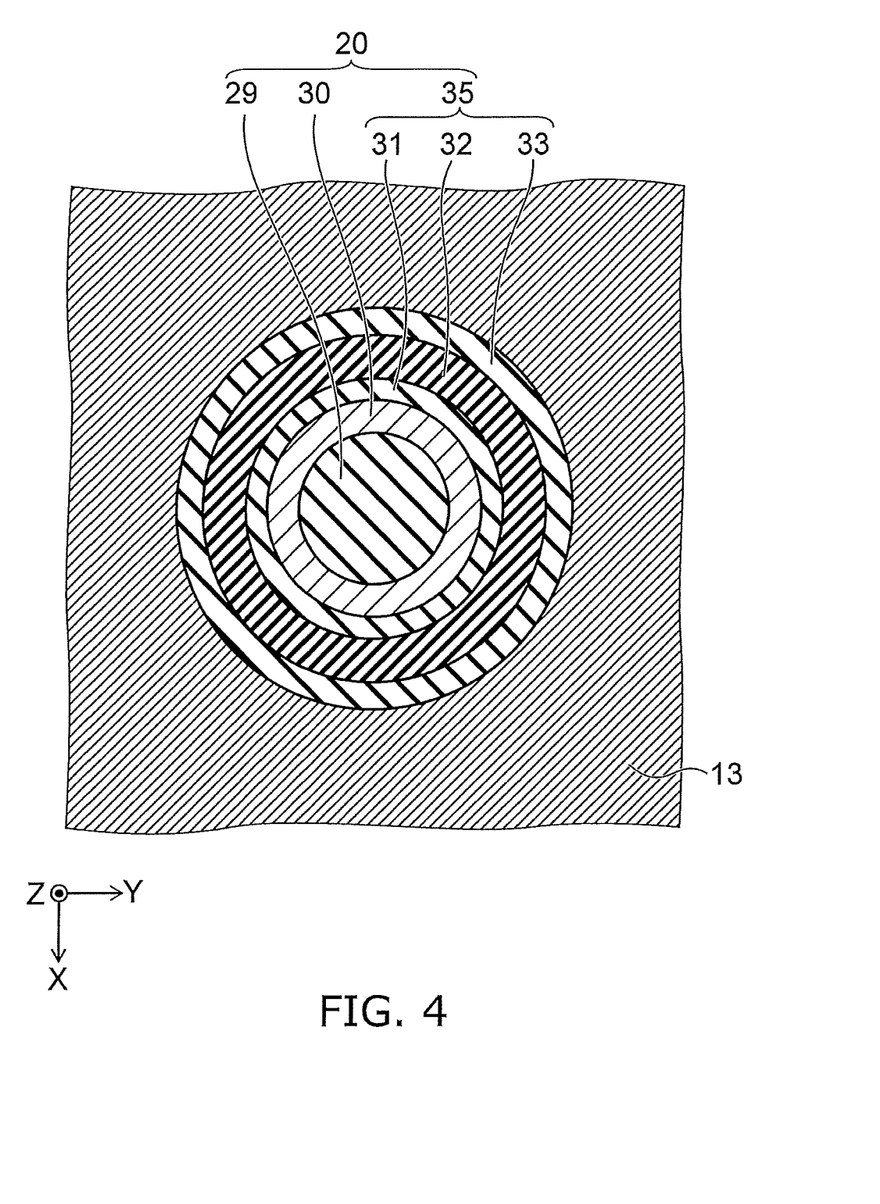
FIGS. 4 and 5 are sectional views showing a memory cell of the semiconductor memory device according to the embodiment.
Figure 5:
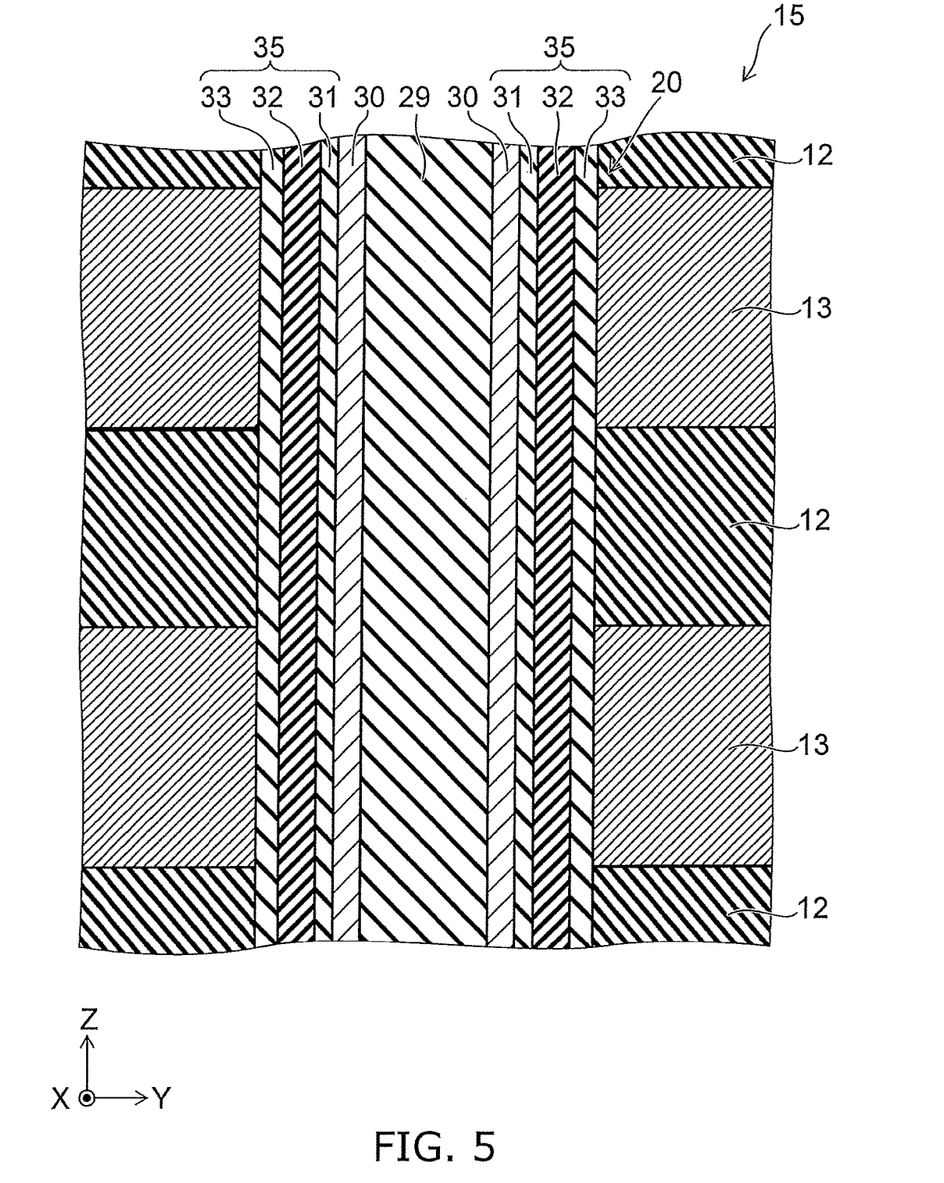

FIGS. 4 and 5 are sectional views showing a memory cell of the semiconductor memory device according to the embodiment.

The drawings are schematic, and are depicted with exaggeration and omission as appropriate. For instance, the depicted components are fewer and larger than in reality. The figures are not necessarily consistent in e.g. the number and size ratio of components.

The semiconductor memory device according to the embodiment is a stacked-type NAND flash memory.

As shown in FIG. 1, the semiconductor memory device 1 (hereinafter also simply referred to as "device 1") according to the embodiment is provided with a silicon substrate 10. The silicon substrate 10 is formed from e.g. a monocrystal of silicon. A memory cell array MA, a control circuit CC, and a memory unit MU are provided in an upper portion of and above the silicon substrate 10. As described later, the memory cell array MA is partitioned into a plurality of blocks Blk. In each block Blk, a plurality of memory cells MC (see FIG. 3) are arranged three-dimensionally. The control circuit CC performs input/output of data with the outside, and writing, reading, and erasing of data on the memory cell MC. The memory unit MU stores information for managing the memory cell MC. For instance, the memory unit MU is composed of ROM-FUSE writable only once.

As shown in FIG. 2, in the memory cell array MA, a silicon oxide film 11 is provided on the silicon substrate 10. In the following, in this specification, an XYZ orthogonal coordinate system is adopted for convenience of description. Two directions parallel to the upper surface 10a of the silicon substrate 10 and orthogonal to each other are referred to as "X-direction" and "Y-direction". The direction perpendicular to the upper surface 10a of the silicon substrate 10 is referred to as "Z-direction". In the Z-direction, the direction from the silicon substrate 10 toward the silicon oxide film 11 is also referred to as "upper", and the opposite direction is also referred to as "lower". However, these expressions are also used for convenience, and irrelevant to the direction of gravity.

In this specification, the "silicon oxide film" refers to a film composed primarily of silicon oxide (SiO) and contains silicon (Si) and oxygen (O). The same also applies to the other components. That is, the component with the designation including a material name is composed primarily of that material. Furthermore, silicon oxide is generally an insulating material. Thus, unless otherwise specified, the silicon oxide film is an insulating film. The same also applies to the other components. That is, in principle, the characteristics of the member reflect the characteristics of its main ingredient.

Silicon oxide films 12 and electrode films 13 are stacked alternately along the Z-direction on the silicon oxide film 11. The electrode film 13 is provided with a body part (not shown) made of e.g. tungsten (W). A barrier metal layer (not shown) made of metal nitride such as titanium nitride (TiN), tungsten nitride (WN), and tantalum nitride (TaN) is provided on the surface of this body part.

A stacked body 15 is formed from the silicon oxide film 11, and a plurality of silicon oxide films 12 and a plurality of electrode films 13 stacked alternately. The longitudinal direction of the stacked body 15 is the X-direction. FIG. 2 is depicted so that the Y-direction length of the stacked body 15 is longer than the X-direction length. However, in reality, the stacked body 15 extends in the X-direction beyond the range shown in FIG. 2. A source electrode plate 17 is provided at positions sandwiching the stacked body 15 in the Y-direction. The lower end of the source electrode plate 17 is connected to the silicon substrate 10. The electrode film 13 is shaped like a strip extending in the X-direction. The longest longitudinal direction thereof is the X-direction, the next longest width direction is the Y-direction, and the shortest thickness direction is the Z-direction.

The device 1 is provided with a plurality of stacked bodies 15 and a plurality of source electrode plates 17, arranged alternately along the Y-direction. An insulating plate 18 (see FIG. 3) made of e.g. silicon oxide is provided between the stacked body 15 and the source electrode plate 17. One stacked body 15 sandwiched between two insulating plates 18 corresponds to one block Blk.

Columnar members 20 extending in the Z-direction and penetrating through the stacked body 15 are provided in the stacked body 15. The lower end of the columnar member 20 is in contact with the silicon substrate 10. The upper end of the columnar member 20 is exposed at the upper surface of the stacked body 15. As described later, one silicon pillar 30 (see FIGS. 3 to 5) is provided in each columnar member 20.

A source line 21 and a plurality of bit lines 22 extending in the Y-direction are provided on the stacked body 15. The source line 21 is connected to the upper end of the source electrode plate 17 through a plug 24. The bit line 22 is connected to the upper end of the silicon pillar 30 through a plug 23. Thus, a current path is formed from the bit line 22 through the plug 23, the silicon pillar 30, the silicon substrate 10, the source electrode plate 17, and the plug 24 to the source line 21. Accordingly, each silicon pillar 30 is connected between the bit line 22 and the source line 21.

In the stacked body 15, one or more stages of electrode films 13 from the top function as upper select gate lines SGD. An upper select gate transistor STD is configured for each crossing portion of the upper select gate line SGD and the columnar member 20. One or more stages of electrode films 13 from the bottom function as lower select gate lines SGS. A lower select gate transistor STS is configured for each crossing portion of the lower select gate line SGS and the columnar member 20. The electrode films 13 other than the lower select gate lines SGS and the upper select gate lines SGD function as word lines WL. A memory cell MC is configured for each crossing portion of the word line WL and the columnar member 20. Thus, a plurality of memory cells MC are connected in series along each silicon pillar 30. The lower select gate transistor STS and the upper select gate transistor STD are connected to both ends of the silicon pillar 30. Accordingly, a NAND string is formed. Dummy electrode films 13 having no electrical function may be placed between the upper select gate line SGD and the word line WL and between the lower select gate line SGS and the word line WL.

An insulating member 19 (see FIG. 2) extending in the X-direction is provided in the Y-direction central part of an upper part of the stacked body 15. The insulating member 19 divides the electrode films 13 constituting the upper select gate lines SGD into two in the Y-direction. The insulating member 19 is made of e.g. silicon oxide. The insulating member 19 is shaped like a strip. The insulating member 19 does not reach the electrode films 13 constituting the word lines WL, and thus does not divide the electrode films 13 constituting the word lines WL. Accordingly, two upper select gate lines SGD arranged at the same height are placed on one word line WL. In other words, the insulating member 19 is placed between two upper select gate lines SGD arranged at the same height.

As shown in FIG. 3, the columnar member 20 is generally shaped like a circular column, and specifically has a bowing shape. The bowing shape is a generally circular column shape having the thickest portion in the longitudinal middle part and continuously thinned from that portion toward both end parts. That is, the diameter of the columnar member 20 is maximized at a position slightly lower than the upper end, continuously decreased from this position toward the top and the bottom, and minimized at the lower end. This shape inevitably occurs due to the constraint of etching technique such as RIE (reactive ion etching) when forming a hole for burying the columnar member 20. The bowing shape shown in FIG. 3 is depicted with exaggeration.

As shown in FIGS. 3 to 5, in the columnar member 20, a core member 29, a silicon pillar 30, a tunnel insulating film 31, a charge storage film 32, and a block insulating film 33 are provided in this order from the central axis toward the peripheral surface. The core member 29 is made of silicon oxide. The core member 29 is shaped like a generally circular column with the axial direction in the Z-direction. The core member 29 is placed at a position including the central axis of the columnar member 20. The silicon pillar 30 is made of polysilicon. The silicon pillar 30 is shaped like a circular cylinder extending in the Z-direction and occluded at the lower end. The tunnel insulating film 31 is provided around the silicon pillar 30. The charge storage film 32 is provided around the tunnel insulating film 31. The block insulating film 33 is provided around the charge storage film 32. The tunnel insulating film 31, the charge storage film 32, and the block insulating film 33 are shaped like a circular cylinder with the axial direction in the Z-direction.

The tunnel insulating film 31 is a film that is normally insulating, but passes a tunnel current under application of a prescribed voltage within the range of the driving voltage of the device 1. For instance, the tunnel insulating film 31 is formed from silicon oxide. The charge storage film 32 is a film capable of storing charge. For instance, the charge storage film 32 is made of a material including electron trap sites, such as silicon nitride. The block insulating film 33 is a film passing substantially no current even under application of voltage within the range of the driving voltage of the device 1. A memory film 35 is formed from the tunnel insulating film 31, the charge storage film 32, and the block insulating film 33.

Next, the operation of the semiconductor memory device according to the embodiment is described.

Figure 6:
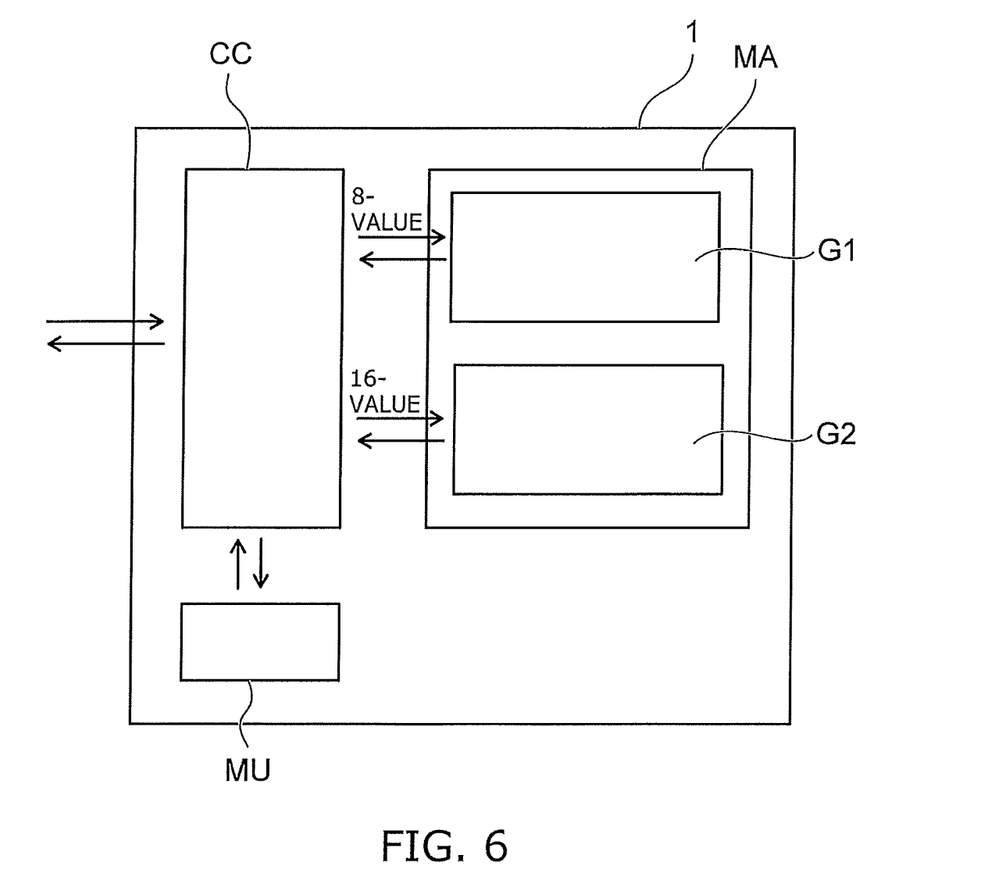
FIG. 6 shows an operation of the semiconductor memory device according to the embodiment.

FIG. 6 shows the operation of the semiconductor memory device according to the embodiment.

Figure 7A:
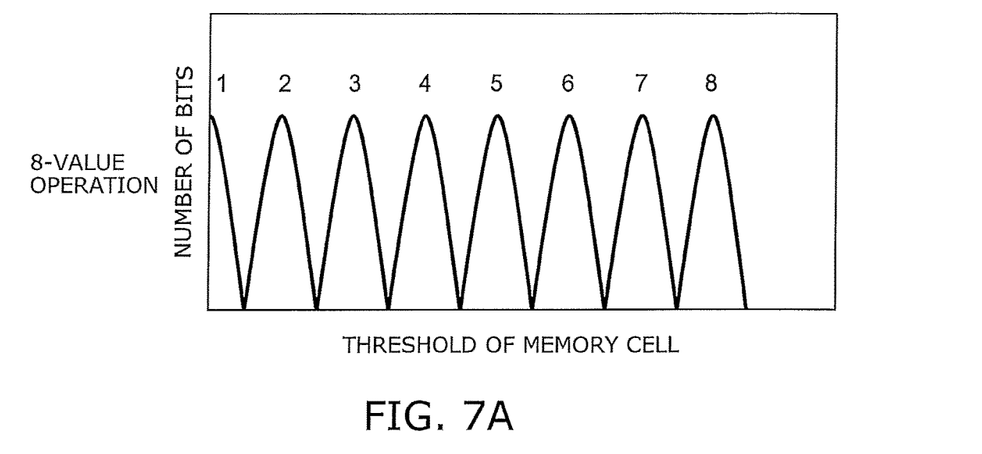
FIGS. 7A and 7B are graphs showing a threshold distribution, the horizontal axis represents the threshold of the memory cell, the vertical axis represents a number of bits.
Figure 7B:
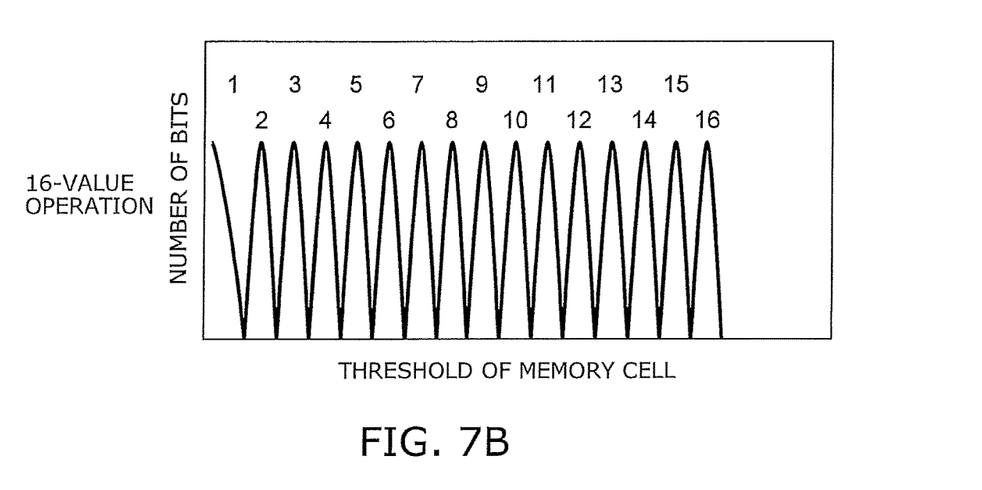

FIGS. 7A and 7B are graphs showing the threshold distribution. The horizontal axis represents the threshold of the memory cell. The vertical axis represents the number of bits. FIG. 7A shows the 8-value operation. FIG. 7B shows the 16-value operation.

Figure 8:
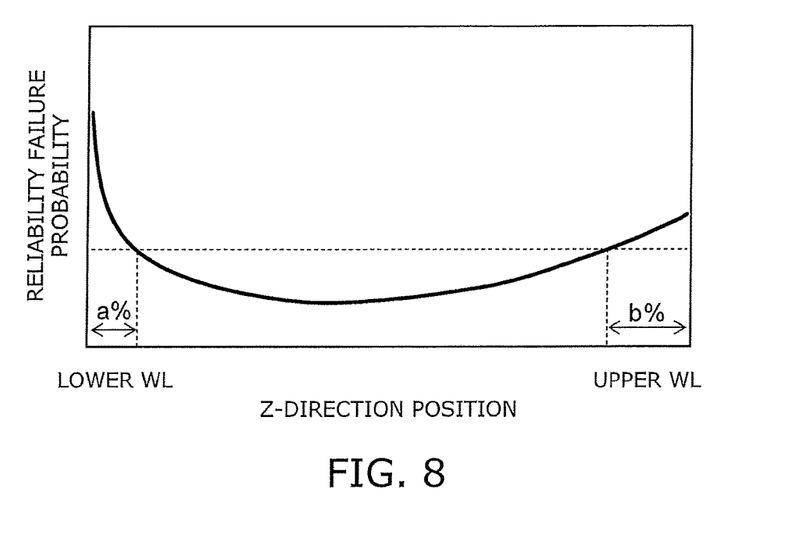
FIG. 8 is a graph showing an influence of a position on reliability of the memory cell, the horizontal axis represents the position in a height direction of a word line, the vertical axis represents reliability failure probability of the memory cell.

FIG. 8 is a graph showing the influence of the position on the reliability of the memory cell. The horizontal axis represents the position in the height direction of the word line. The vertical axis represents the reliability failure probability of the memory cell.

Figure 9:
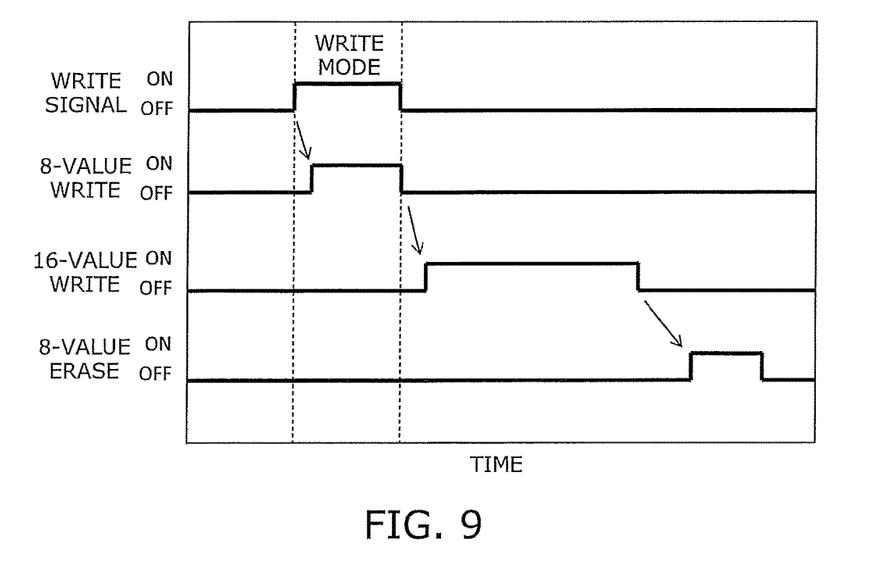
FIG. 9 is a timing chart showing the operation of the semiconductor memory device according to the embodiment, the horizontal axis represents time, the vertical axis represents a value of each signal.

FIG. 9 is a timing chart showing the operation of the semiconductor memory device according to the embodiment. The horizontal axis represents time. The vertical axis represents the value of each signal.

As shown in FIG. 6, in the semiconductor memory device 1 according to the embodiment, the memory cells MC are classified into an 8-value operation group G1 and a 16-value operation group G2. In the memory cell MC belonging to the 8-value operation group G1, 8-value data is written, and read as 8-value data. As shown in FIG. 7A, in the memory cell MC of the 8-value operation group G1, the threshold is written distinctively so as to assume one of 8-level values. Each value of the threshold corresponds to each value of data. On the other hand, in the memory cell MC belonging to the 16-value operation group G2, 16-value data is written, and read as 16-value data. As shown in FIG. 7B, in the memory cell MC of the 16-value operation group G2, the threshold is written distinctively so as to assume one of 16-level values. Each value of the threshold corresponds to each value of data.

In the case of writing 16-value data to the memory cell MC, the amount of data that can be stored in one memory cell MC is larger than in the case of writing 8-value data. This increases the recording density. However, writing the threshold distinctively in 16-level values requires high write characteristics of the memory cell MC. Thus, the yield of the memory cell MC decreases depending on the variation of the process condition. In general, in the case of writing 16-value data, the number of repetitions of application and verification of the write voltage is larger than in the case of writing 8-value data. This makes the write time longer.

Thus, in the embodiment, the memory cells MC having relatively high write characteristics and being easy to write 16-value data are classified into the 16-value operation group G2. The memory cells MC having relatively low write characteristics and being difficult to write 16-value data are classified into the 8-value operation group G1. Then, cell management information indicating whether a given memory cell MC belongs to the 8-value operation group G1 or the 16-value operation group G2 is stored in the memory unit MU.

As shown in FIG. 6, in response to input of data from outside the device 1, the control circuit CC refers to the cell management information recorded in the memory unit MU to identify whether the memory cell MC to be written belongs to the 8-value operation group G1 or the 16-value operation group G2. The control circuit CC converts the data to 8-value data for input to the memory cell MC belonging to the 8-value operation group G1. The control circuit CC converts the data to 16-value data for input to the memory cell MC belonging to the 16-value operation group G2. On the other hand, when the control circuit CC reads data, the control circuit CC still refers to the cell management information recorded in the memory unit MU. When reading data from the memory cell MC belonging to the 8-value operation group G1, the control circuit CC reads data as 8-value data. When reading data from the memory cell MC belonging to the 16-value operation group G2, the control circuit CC reads data as 16-value data.

Next, the classification method of the memory cells MC is described.

A plurality of methods are considered as the classification method of the memory cells MC. In the following description, four methods are taken as an example.

In the first classification method, after the semiconductor memory device 1 is manufactured and before factory shipment, the write characteristics of all the memory cells MC are evaluated, and the memory cells MC are classified based on the evaluation result. Specifically, 16-value data is written to all the memory cells MC a plurality of times. The memory cells MC with the failure rate being a prescribed reference value or more are classified into the 8-value operation group G1. The memory cells MC with the failure rate being less than the reference value are classified into the 16-value operation group G2.

The second classification method focuses on the position of the word line WL constituting the memory cell MC.

As shown in FIG. 8, the failure probability of the memory cell MC is correlated with the Z-direction position of the word line WL constituting this memory cell MC. The word lines WL on the lower layer side and the word lines WL on the upper layer side tend to exhibit a higher failure probability than the word lines WL in the central portion.

The reason for this is estimated as follows. As shown in FIG. 3, the silicon pillar 30 has a bowing shape. The diameter of the lower part is smaller than the diameter of the central part and the upper part. The shape of the silicon pillar 30 in the X-Y cross section has a larger distortion and tends to deviate from a perfect circle toward the lower layer side. This results from the difficulty of etching for a deeper hole when forming a hole for burying the columnar member 20. Thus, the silicon pillar 30 has a smaller diameter and a large shape distortion toward the lower layer side. A smaller diameter increases the influence of distortion. Thus, toward the lower layer side, the write characteristics of the memory cell MC become unstable, which is considered to increase the failure probability.

On the other hand, in the upper part of the silicon pillar 30, a high voltage is applied between the word line WL and the upper select gate line SGD or between the word line WL and the dummy electrode. Thus, unexpected hole-electron pairs are likely to be generated in the silicon pillar 30, and miswrite is likely to occur. Accordingly, it is considered that the memory cells MC on the upper layer side exhibit lower write characteristics.

The tendency as described above holds between the failure probability of the memory cell MC and the Z-direction position of the word line WL. Thus, several layers of memory cells MC on the lower layer side and several layers of memory cells MC on the upper layer side may be all classified into the 8-value operation group G1. The other memory cells MC may be classified into the 16-value operation group G2. For instance, as shown in FIG. 8, a % on the lower layer side and b % on the upper layer side of the word lines WL are expected to exhibit a failure probability of a prescribed reference value or more. The memory cells MC constituted by these word lines WL are classified into the 8-value operation group G1. The memory cells MC constituted by the remaining word lines WL are classified into the 16-value operation group G2. According to this second classification method, there is no need to inspect write characteristics for all the memory cells MC. This can reduce the manufacturing cost of the device 1, and avoid degradation of memory cells MC due to inspection.

The third classification method focuses on the block Blk to which the memory cell MC belongs.

As shown in FIG. 1, different blocks Blk occupy different positions in the device 1. Thus, the condition of the manufacturing process may vary with the blocks Blk. Accordingly, a block Blk having favorable write characteristics on average and a block Blk having unfavorable write characteristics may be formed in one device 1. In this case, the memory cells MC of the block Blk having favorable write characteristics are classified into the 16-value operation group G2. The memory cells MC of the block Blk having unfavorable write characteristics are classified into the 8-value operation group G1. Also according to this third classification method, there is no need to inspect write characteristics for all the memory cells MC. This can reduce the manufacturing cost of the device 1, and avoid degradation of memory cells MC due to inspection.

It is also possible to combine the second classification method and the third classification method. For instance, the value a and the value b shown in FIG. 8 may be made relatively small for the block Blk having favorable write characteristics. The value a and the value b may be made relatively large for the block Blk having unfavorable write characteristics.

The fourth classification method focuses on the position of the device 1 in the wafer.

When manufacturing the device 1, numerous devices 1 are simultaneously manufactured from one wafer. However, the condition of the manufacturing process inevitably varies with the position on the wafer. Thus, the value a and the value b described above may be adjusted based on the position of the device 1 in the manufacturing process of the device 1.

Thus, a plurality of methods are considered as the method for classifying the memory cells MC into the 8-value operation group G1 and the 16-value operation group G2. The classification method is not limited to the above four examples. Furthermore, the above four methods may be combined. For instance, write characteristics of several randomly-selected memory cells MC may be evaluated. Based on the result thereof, the influence of the position of the word line WL, the position of the block Blk, and the position in the wafer exerted on the write characteristics of the memory cells MC may be statistically grasped and used as an index for classification.

Next, a method for achieving compatibility between the reduction of write time and the improvement of recording density by appropriately using the 8-value operation group G1 and the 16-value operation group G2 is described.

As shown in FIG. 9, the externally inputted write signal becomes "ON", and the device 1 is turned to the write mode. At this time, the control circuit CC tentatively writes the externally inputted data as 8-value data to the memory cell MC of the 8-value operation group G1. As described above, the write speed of 8-value data is faster than the write speed of 16-value data. Thus, the entire write time can be reduced by using 8-value write.

Next, the write signal becomes "OFF", and the device 1 becomes out of the write mode. Then, the control circuit CC reads the data written to the memory cell MC of the 8-value operation group G1. The control circuit CC converts it to 16-value data and writes it to the memory cell MC of the 16-value operation group G2. After writing of this 16-value data is completed, the control circuit CC erases the data from the memory cell MC of the 8-value operation group G1. Thus, the data is rewritten from the 8-value operation group G1 to the 16-value operation group G2. This can reduce the number of memory cells MC used and improve the recording density. When the write signal becomes "ON" again during rewriting of data, the rewriting of data is paused. The data newly inputted from outside is written to the memory cell MC of the 8-value operation group G1. After the write signal becomes "OFF", the rewriting of data can be resumed.

Next, the effect of the embodiment is described.

According to the embodiment, the memory cells MC having write characteristics insufficient for operation in 16 values are operated in 8 values. This can improve the yield of the memory cell MC, and thus improve the yield of the semiconductor memory device 1. On the other hand, the memory cells MC having favorable write characteristics are operated in 16 values. This can improve the recording density compared with the case of operating all the memory cells MC in 8 values.

The externally inputted data is once written as 8-value data to the memory cell MC of the 8-value operation group G1. After the write mode is completed, the 8-value data is converted to 16-value data and written to the memory cell MC of the 16-value operation group G2. This can achieve compatibility between the reduction of write time and the improvement of recording density.

In the example shown in the embodiment, the memory cell MC is operated in 8 values or 16 values. However, the embodiment is not limited thereto. The memory cell MC can be operated in arbitrary n values (n being an integer of two or more) and m values (m being an integer larger than n). For instance, the memory cell MC can be operated in $2^s$ values (s being an integer of one or more) and $2^{s+1}$ values.

The embodiment described above can realize a semiconductor memory device capable of achieving compatibility between high integration and high yield.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor memory device comprising:
    a substrate;
    a plurality of electrode films provided on a first direction side of the substrate and arranged with spacing from each other along the first direction;
    a plurality of semiconductor members extending in the first direction;
    a charge storage member provided between each of the plurality of electrode films and each of the plurality of semiconductor members;
    a control circuit configured to classify a plurality of memory cells formed in crossing portions of the plurality of electrode films and the plurality of semiconductor members into a first group and a second group, to perform writing, reading, and erasing of n-value data (n being an integer of two or more) on the memory cell of the first group, and to perform writing, reading, and erasing of m-value data (m being an integer larger than n) on the memory cell of the second group; and an insulating plate extending along the first direction and a second direction crossing the first direction and dividing the plurality of electrode films along a third direction crossing a plane including the first direction and the second direction, wherein the plurality of memory cells are partitioned into a plurality of blocks by the insulating plate, the memory cell belonging to one of the plurality of blocks belongs to the first group, and the memory cell belonging to another of the plurality of blocks belongs to the second group.

2. The device according to claim 1, further comprising:
a memory unit configured to store information indicating whether each of the plurality of memory cells belongs to the first group or the second group.

3. A semiconductor memory device comprising:
a substrate;
a plurality of electrode films provided on a first direction side of the substrate and arranged with spacing from each other along the first direction;
a plurality of semiconductor members extending in the first direction;
a charge storage member provided between each of the plurality of electrode films and each of the plurality of semiconductor members; and
a control circuit configured to classify a plurality of memory cells formed in crossing portions of the plurality of electrode films and the plurality of semiconductor members into a first group and a second group, to perform writing, reading, and erasing of n-value data (n being an integer of two or more) on the memory cell of the first group, and to perform writing, reading, and erasing of m-value data (m being an integer larger than n) on the memory cell of the second group, wherein one of the plurality of memory cells constituted by one of the plurality of electrode films belongs to the first group, and other of the plurality of memory cells constituted by another of the plurality of electrode films belongs to the second group, and the memory cells constituted by a first proportion of the plurality of electrode films placed on the substrate side and the memory cells constituted by a second proportion of the plurality of electrode films placed on opposite side from the substrate belong to the first group.

4. The device according to claim 1, wherein when in write mode, the control circuit writes externally inputted data as the n-value data to the memory cell of the first group, and when not in the write mode, the control circuit converts the n-value data written to the memory cell of the first group to the m-value data and writes it to the memory cell of the second group.

5. The device according to claim 1, wherein the n is $2^s$ (s being an integer of one or more), and the m is $2^{s+1}$.

6. The device according to claim 1, wherein the n is 8, and the m is 16.

7. The device according to claim 3, further comprising:
a memory unit configured to store information indicating whether each of the plurality of memory cells belongs to the first group or the second group.

8. The device according to claim 3, wherein when in write mode, the control circuit writes externally inputted data as the n-value data to the memory cell of the first group, and when not in the write mode, the control circuit converts the n-value data written to the memory cell of the first group to the m-value data and writes it to the memory cell of the second group.

9. The device according to claim 3, wherein the n is $2^s$ (s being an integer of one or more), and the m is $2^{s+1}$.

10. The device according to claim 3, wherein the n is 8, and the m is 16.

11. A semiconductor memory device comprising:
a substrate;
a plurality of electrode films provided on a first direction side of the substrate and arranged with spacing from each other along the first direction;
a plurality of semiconductor members extending in the first direction;
a charge storage member provided between each of the plurality of electrode films and each of the plurality of semiconductor members; and
a control circuit configured to classify a plurality of memory cells formed in crossing portions of the plurality of electrode films and the plurality of semiconductor members into a first group and a second group, to perform writing, reading, and erasing of n-value data (n being an integer of two or more) on the memory cell of the first group, and to perform writing, reading, and erasing of m-value data (m being an integer larger than n) on the memory cell of the second group, wherein when in write mode, the control circuit writes externally inputted data as the n-value data to the memory cell of the first group, and when not in the write mode, the control circuit converts the n-value data written to the memory cell of the first group to the m-value data and writes it to the memory cell of the second group.

12. The device according to claim 11, further comprising:
a memory unit configured to store information indicating whether each of the plurality of memory cells belongs to the first group or the second group.

13. The device according to claim 11, wherein one of the plurality of memory cells constituted by one of the plurality of electrode films belongs to the first group, and other of the plurality of memory cells constituted by another of the plurality of electrode films belongs to the second group.

14. The device according to claim 11, wherein writing and reading of the m-value data are performed on the plurality of memory cells, the memory cells with a failure probability being a reference value or more are caused to belong to the first group, and the memory cells with the failure probability being less than the reference value are caused to belong to the second group.

15. The device according to claim 11, wherein the n is $2^s$ (s being an integer of one or more), and the m is $2^{s+1}$.

16. The device according to claim 11, wherein the n is 8, and the m is 16.

* * * * *